(12) United States Patent
Sofer et al.

(10) Patent No.: US 8,089,259 B2
(45) Date of Patent: Jan. 3, 2012

(54) INTEGRATED CIRCUIT AND A METHOD FOR RECOVERING FROM A LOW-POWER PERIOD

(75) Inventors: Sergey Sofer, Rishon Lezion (IL); Vlad Goldman, Kfar Saba (IL); Dov Tzytkin, Nes Zyiona (IL)

(73) Assignee: Freescale Semiconductor, Inc., Austin, TX (US)

(*) Notice: Subject to any disclaimer, the term of this patent is extended or adjusted under 35 U.S.C. 154(b) by 391 days.

(21) Appl. No.: 12/261,599

(22) Filed: Oct. 30, 2008

(65) Prior Publication Data

US 2010/0109633 A1 May 6, 2010

(51) Int. Cl.
*G05F 3/16* (2006.01)
*G05F 3/20* (2006.01)
(52) U.S. Cl. ............................. 323/313; 323/314
(58) Field of Classification Search ........... 323/312–317
See application file for complete search history.

(56) References Cited

U.S. PATENT DOCUMENTS

| | | | |
|---|---|---|---|
| 5,019,770 A | 5/1991 | Harada et al. | |
| 5,534,675 A | 7/1996 | Kaneko et al. | |
| 5,736,842 A | 4/1998 | Jovanovic | |
| 6,061,253 A | 5/2000 | Igarashi et al. | |
| 6,118,261 A | 9/2000 | Erdelyi et al. | |
| 6,208,194 B1 | 3/2001 | Kennedy | |
| 2002/0047742 A1 | 4/2002 | Setogawa | |
| 2002/0057076 A1* | 5/2002 | Hwang | 323/225 |
| 2003/0062947 A1 | 4/2003 | Grasso et al. | |
| 2006/0033551 A1 | 2/2006 | Dong et al. | |
| 2007/0257705 A1 | 11/2007 | Blisson | |
| 2009/0009151 A1* | 1/2009 | Arnold | 323/313 |

OTHER PUBLICATIONS

PCT/US2009/058130 Search Report and Written Opinion, Mailed May 3, 2010.

* cited by examiner

*Primary Examiner* — Adolf Berhane
*Assistant Examiner* — Emily Pham

(57) ABSTRACT

A system that has low power recovery capabilities, the system includes: a switch that is adapted to provide a gated power supply to a power gated circuit in response to a control current; and a control signal generator adapted to control an intensity of the control current in response to a reception of a low power period end indicator, a value of the continuous supply voltage at a port of the control signal generator, a value of the gated supply voltage and an output signal of a high switching point buffer that is inputted by the gated supply voltage.

20 Claims, 4 Drawing Sheets

US 8,089,259 B2

INTEGRATED CIRCUIT AND A METHOD FOR RECOVERING FROM A LOW-POWER PERIOD

FIELD OF THE INVENTION

This disclosure relates generally to an integrated circuit and a method for recovering from a low-power period.

BACKGROUND OF THE INVENTION

The power consumption of an integrated circuit can be reduced by completely shutting down one or more modules (circuits) of the integrated circuit. These circuits are shut down during one or more low-power periods. These shut-down circuits are also known as power-gated circuits as they receive a gated supply during non-low-power periods and do not receive the gated supply during the low-power period.

State retention power gating (SRPG) involves shutting down (by an on-die switch or often by multiple switch devices) the power-gated circuits while saving their status during low-power periods. Integrated circuits in which this technique is implemented include retention circuits that are powered by the continuous (retention) power supply and store, during each low-power period, state information reflecting a state of a power-gated circuit.

The low-power period ends by performing a power up process (also referred to recovery process) during which the gated supply voltage is provided to the power gated circuit (by connection of the gated supply to main continuous supply by a switch device) and then state information is sent to the power gated circuits.

A typical integrated circuit includes a very large number (hundreds, thousands, and even more) of SRPG flip-flops, each including a state retention circuit and a power gated circuit.

Retention circuits are usually fed by a local continuous power grid that can be weak in the sense of the amount of power it can convey and is connected to the main continuous power grid and has a low local intrinsic capacitance and therefore is susceptible to noise. This noise can be caused by e.g. powering up multiple power gated circuit components during a power up process that ends the low-power period. This power up process comprises charging the intrinsic capacitance of the power gated circuit, accompanied by large main continuous power supply current drain, causing (this current-induced) power grid voltage sag and ground voltage bounce (also known as IR-drop). Obviously, the retention power grid connected to the main continuous power grid outside the power gated circuit, becomes noisy as well. The noise cannot be adequately suppressed by the retention power grid and can cause retained state information errors. In order to eliminate such noise, it is known to very slow increment the gated supply voltage level during the powering up process, in order to reduce the mentioned current drain and to e.g. connect the retention circuits to the power gated circuits by multiple switch devices in a sequential manner or to establish a significant power switch impedance during the powering up process. The attempt to eliminate completely the retention power grid noises usually has highest priority compare to the other power up process parameters. Hence, the powering up process is usually very long. The duration of this process often determines whether or not is worth to use the low power mode, and is therefore critical for the integrated circuit power consumption reduction.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It has been found that the exit from a low power period can be accelerated by selectively activating a strong current drain that contributed to a control current that controls a switch that selectively provides a gated supply voltage. The control current can be responsive, during at least one period, to a voltage drop that is developed within a continuous voltage supply grid.

Figure 1:
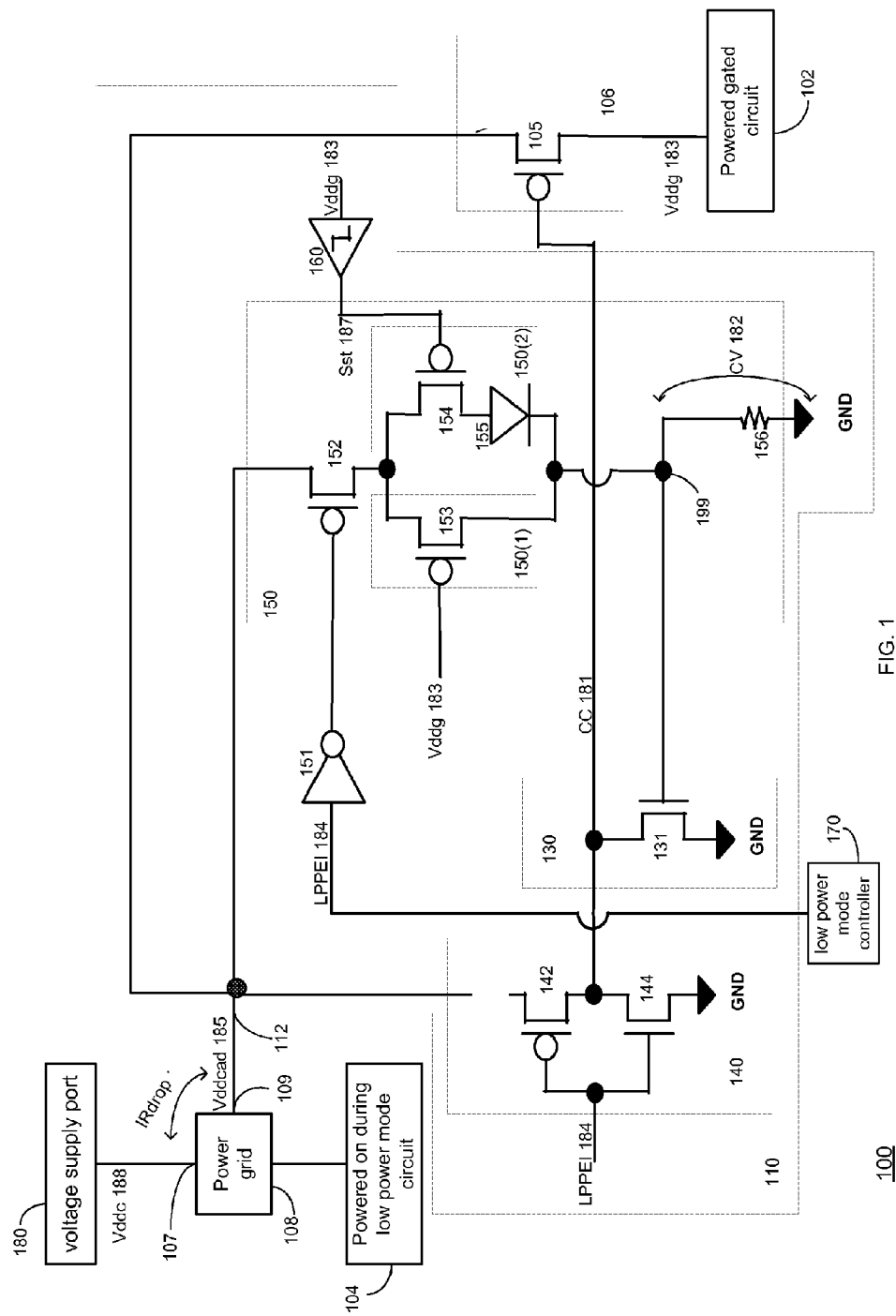
FIG. 1 schematically shows an example of an embodiment of a system.

FIG. 1 schematically shows an example of an embodiment of a system 100. The shown system 100 includes a power gated circuit 102, a powered on during low power mode circuit 104, a switch 106, a power grid 108, a low power mode controller 170 and a control signal generator 110. The control signal generator 110 includes a Schmidt trigger circuit 160, a weak current driver 140, a strong current drain 130, and a strong current drain controller 150.

As shown in FIG. 1, switch 106 can include a first PMOS transistor 105 that has a gate that is connected to weak driver 140 and strong current drain 130 in order to receive a control current CC 181. CC 181 controls first PMOS transistor 105. Especially, the intensity of CC 181 determines how fast first PMOS transistor 105 "opens"—e.g. how fast a capacitance (such as a gate) of first PMOS transistor 105 is discharged—in order to enable First PMOS transistor 105 to conduct.

The source of First PMOS transistor 105, a source of second PMOS transistor 152 and a source of fifth PMOS transistor 142 of weak driver 140 are connected to a first node 109 of power grid 108 at a port 112 of control signal generator 110.

Another node 107 of power grid 108 is connected to continuous voltage supply port 180. Continuous voltage supply port 180 can be an output port of a continuous voltage supply circuit or an output port of another circuit (such as a pad of an integrated circuit) that receives the continuous power supply Vddc 188. A power supply voltage drop (also referred to as IRdrop) is developed on power grid 108—between node 107 and node 109. For simplicity of explanation the continuous supply voltage at node 107 is denoted Vddc while the continuous supply voltage at node 109 is denoted Vddcad (Vddc after IRdrop). In mathematical terms, assuming that the IR drop is denoted with IRdrop, then:

$$Vddc = IRdrop + Vddcad \quad (1)$$

The drain of first PMOS transistor 105 provides a gated supply voltage Vddg 183 to power gated circuit 102 in response to CC 181. Vddg 183 gradually increases as first PMOS transistor 105 gradually opens, during a first period, a second period and a third period of time that follow the end of the low power period, as is explained below in more detail.

Control signal generator 110 is adapted to control an intensity of control current 181 based on a low power period end indicator (LPPEI) 184, a value of Vddcad 185, a value of Vddg 183 and an output signal (Sst) 187 of high switching point buffer 160 that is fed by Vddg 183. The intensity of control current 181 can be positive when LPPEI 184 is positive.

Output signal Sst 187 of high switching point buffer 160 can be a high value (HV) or a low value (LV). The high value (HV) is set above a first value of Vddg 183 that closes first branch 150(1) of strong current drain controller 150. HV can e.g. be few hundred millivolts above the first value of Vddg 183.

The shown strong current drain controller 150 includes inverter 151, second PMOS transistor 152, third PMOS transistor 153, fourth PMOS transistor 154, diode 155 and resistor 156. First branch 150(1) of strong current drain controller 150 includes third PMOS transistor 153. A second branch 150(2) includes fourth PMOS transistor 154 and diode 155.

An input of inverter 151 receives LPPEI 184 and its output is connected to a gate of second PMOS transistor 152. The source of second PMOS transistor 152 is connected to port 112 of control signal generator 110. The drain of second PMOS transistor 152 is connected to the sources of third and fourth PMOS transistors 153 and 154. The drain of third PMOS transistor 153 is connected to a node 199. Node 199 is also connected to a first end of resistor 156, to cathode of diode 155 and to a gate of NMOS transistor 131. NMOS transistor 131 is included within strong current drain 130. The voltage at node 199 is also referred to control voltage (CV) 182. The drain of fourth PMOS transistor 154 is connected to anode of diode 155 while another end of the diode is connected to node 199.

The gate of third PMOS transistor 153 receives Vddg 183. The gate of fourth PMOS transistor 154 receives Sst 187. Third PMOS transistor 153 becomes closed when Vddg 183 reaches a first value V1. Fourth PMOS transistor 154 becomes closed when Vddg 183 reaches a second value (V2) that is higher than the first value (V1). When Vddg 183 reaches the second value, Sst 187 turns from the low value (LV) to the high value (HV) and fourth PMOS transistor 154 closes.

Weak current driver 140 includes an inverter that includes fifth PMOS transistor 142 and second NMOS transistor 144. The gates of fifth PMOS transistor 142 and second NMOS transistor 144 receive LPPEI 184 (from low power mode controller 170—but for simplicity of explanation this connection is not shown) and provide an inverted signal (IS) 181 to the gate of first PMOS transistor 105. The weak current driver 140 drives a logic high value when the circuit is in low power mode and is driving logic low value if the circuit is in non-low power mode.

Strong current drain 130 contributes to CC 181 when it is activated. It speeds up the opening of first PMOS transistor 105 by increasing the discharge rate of the gate capacitor of the first PMOS transistor 105. Strong current drain 130 determines the first PMOS transistor 105 gate potential discharge rate indifferent to the voltage of Vddcad 185 during a first period and determines the first PMOS transistor 105 gate potential discharge rate dependent on the voltage of Vddcad 185 during a second period.

Strong current drain 130 is capable of generating a current that is stronger than the current drained by weak driver 140.

Figure 2:
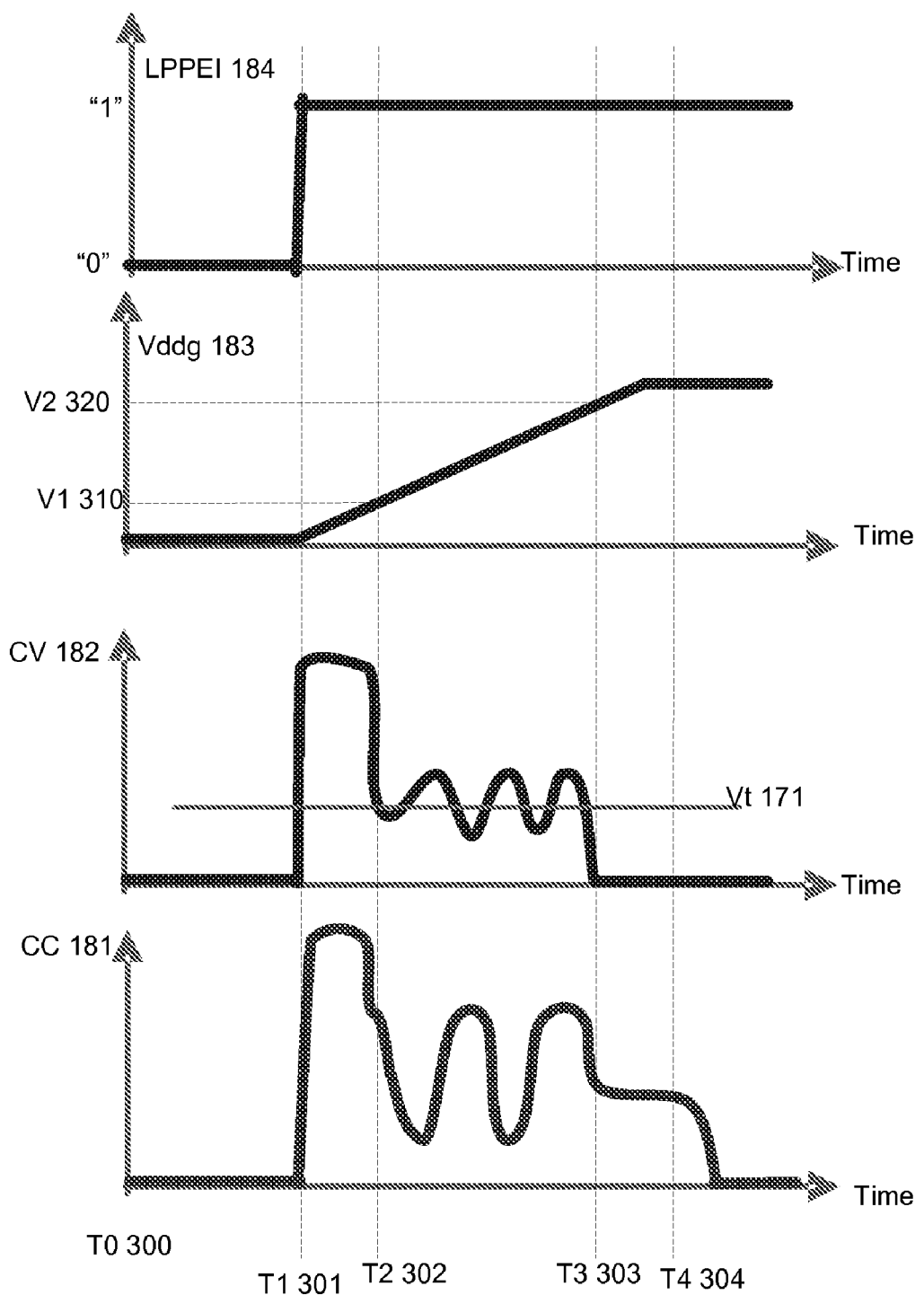
FIG. 2 schematically shows an example of an embodiment of various signals.

Referring to FIG. 2, the first period starts at point in time T1 301—after a reception of the low power end indicator LPPEI 184 and ends at point in time T2–Vddg 183 reaches first value V1 310. The second period starts at a point in time after the beginning of the first period (it can start a T2 302 but this is not necessarily so as it can start after T1 301) and ends at point in time T3 303—when Vddg 1 83 reaches V2 320 that is higher than V1 310 and causes high switching point buffer 160 to output a high value signal that closes fourth PMOS transistor 154. The first PMOS transistor 105 gate potential discharge current is responsive to a value of voltage drop (also referred to as IRdrop) over power grid 108 in the FIG. 1.

Thus, during the first period the first PMOS transistor 105 gate potential discharge rate is accelerated by providing CC 181 that is not responsive to IRdrop while during the second period the discharge rate is accelerated by providing CC 181 that is responsive to IRdrop, as higher IRdrop values decrease the conductivity of strong current drain 130 and even shut it down while lower IR values increase the conductivity of strong current drain 130.

Especially, diode 155 acts as a biasing element that converts Vddcad 185 to CV 182, wherein during the second period CV 182 can change (in response to changes in IRdrop) within a voltage range that includes the threshold voltage (Vth) of first NMOS transistor 131. Thus, different values of IRdrop can activate or deactivate strong current drain 130 and thus affect the value of CC 181. In other words, forward biased diode 155 translates Vddcad 185 (actually responsive to the amount of IRdrop) to a voltage (CV 182) that activates strong current drain 150 and translates a large amount of IRdrop to a control voltage decrease that deactivates the strong current drain.

During the first period third PMOS transistor 153 "mirrors" Vddcad 185 to CV 182 so that CV 182 substantially equals Vddcad 185. Vddcad 185 is expected to be much higher than the threshold voltage of first NMOS transistor 131 and changes in IRdrop are not expected to alter the conductivity of first NMOS transistor 131. Accordingly, during the first period strong current drain 150 generates a voltage drop indifferent draining current.

FIG. 2 also illustrates CV 182 and CC 181. Both signals are very low (zero level) between T0 300 and T1 301, jump to a very high level at T1 and substantially maintain at this level during the entire first period. During the second period both signals fluctuate wherein during the second period CV can fluctuate below and above the threshold voltage VT 171 of first NMOS transistor 131.

CC 181 is above zero during a third period that follows the second period and later on drops to zero. At the end of the third period Vddg 183 reaches its maximum value.

Figure 3:
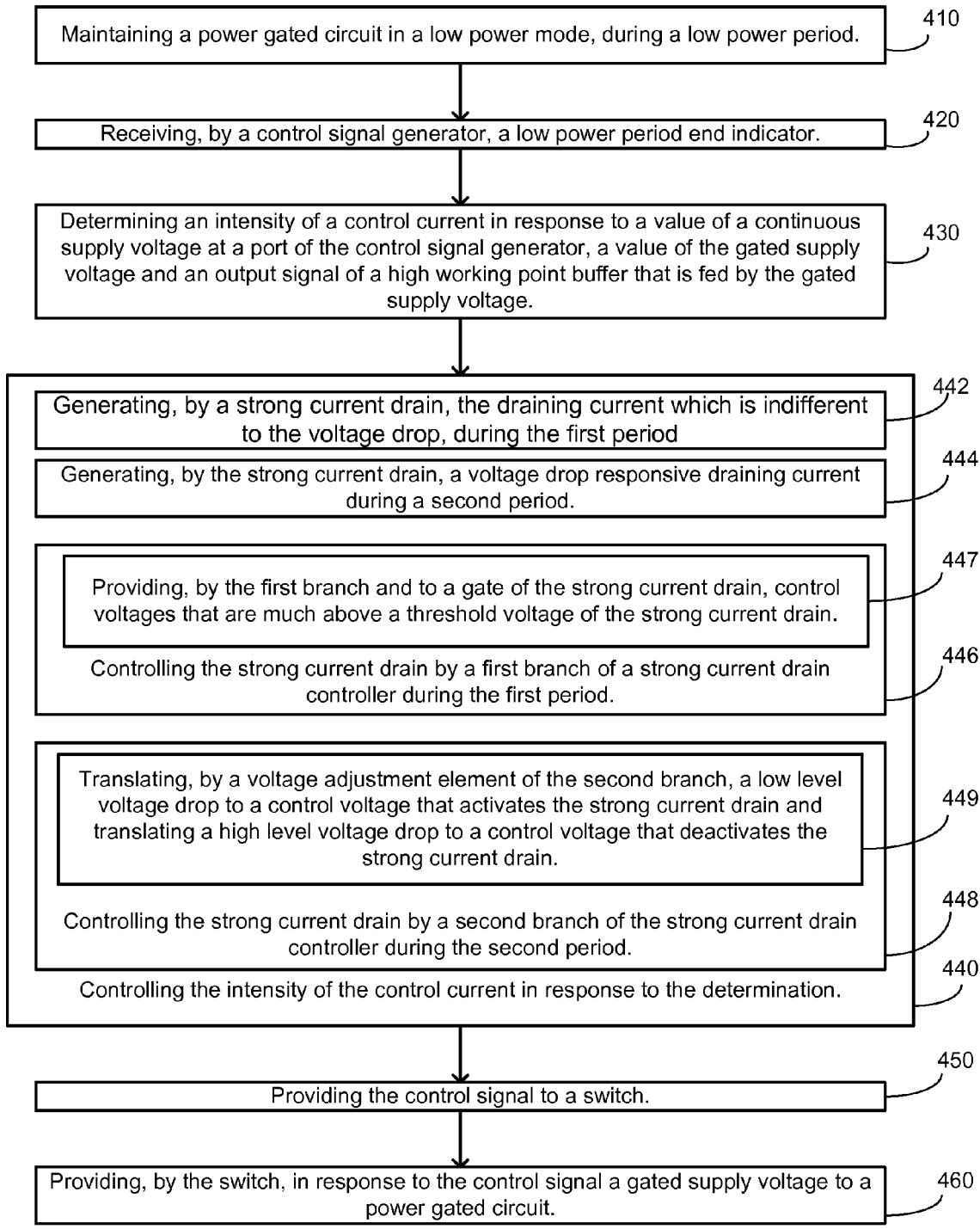
FIG. 3 schematically shows an example of an embodiment of a method.

FIG. 3 schematically shows an example of an embodiment of method 400.

Method 400 for recovering from a low-power period starts by stage 410 of maintaining a power gated circuit in a low power mode, during a low power period.

Stage 410 is followed by stage 420 of receiving, by a control signal generator, a low power period end indicator.

Stage 420 is followed by stage 430 of determining an intensity of a control current, charging the switch device gate, in response to a value of a continuous supply voltage at a port of the control signal generator, a value of the gated supply voltage and an output signal of high switching point buffer 160 that is inputted by the gated supply voltage.

Stage 430 is followed by stage 440 of controlling the intensity of the control current in response to the determination.

Stage 440 is followed by stage 450 of providing the control signal to a switch.

Stage 450 is followed by stage 460 of providing, by the switch, in response to the control signal a gated supply voltage to a power gated circuit.

Stage 440 can include stage 442 of generating, by a strong current drain, the draining current which is indifferent to the voltage drop during the first period.

Stage 440 can also include stage 444 of generating, by the strong current drain, a week voltage drop responsive draining current during a second period. The voltage drop responsive draining current is responsive to a value of a voltage drop that represents a difference between the value of the continuous supply voltage at the port of the control signal generator and the value of the continuous supply voltage at a continuous voltage supply port.

Accordingly, during the first and second periods the control current can include at least one of the voltage drop indifferent draining current and the voltage drop responsive draining current.

Stage 440 can include stages 446 and 448. Stage 446 includes controlling the strong current drain by a first branch of a strong current drain controller during the first period. Stage 448 includes controlling the strong current drain by a second branch of the strong current drain controller during the second period.

Stage 448 can include stage 449 of translating, by a voltage adjustment element of the second branch, a low amount of voltage drop to a control voltage that activates the strong current drain and translating a high amount of retention power supply to a control voltage that deactivates the strong current drain. Stage 449 can include utilizing a voltage adjustment element that may include (but not necessarily) a forward biased diode.

Stage 449 can include providing, by the second branch and to the gate of the strong current drain control, voltages within a voltage range that comprises the threshold voltage of the strong current drain.

Stage 446 can include stage 447 of providing, by the first branch and to a gate of the strong current drain, control voltages that are much above a threshold voltage of the strong current drain.

Figure 4:
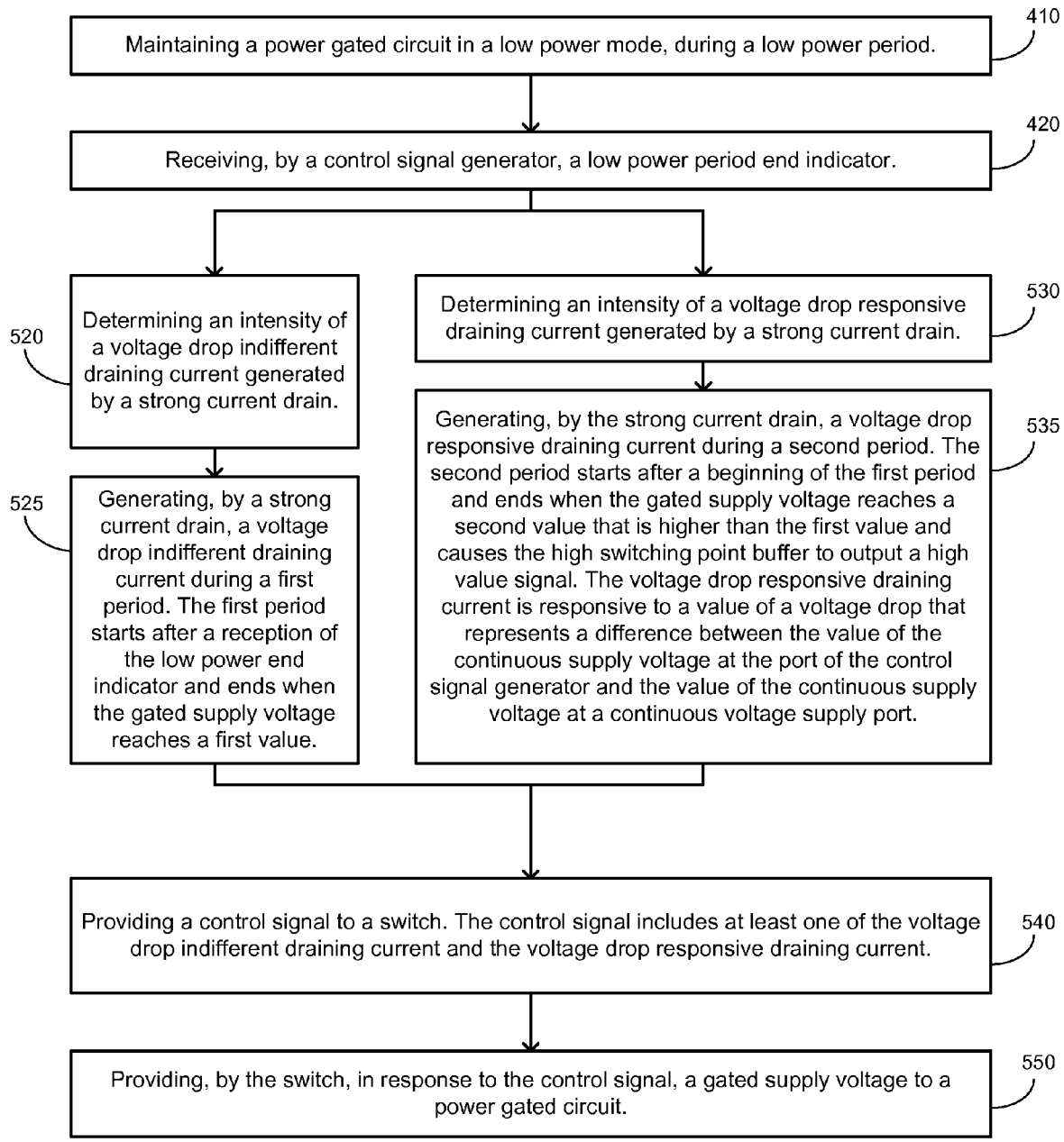
FIG. 4 schematically shows an example of an embodiment of a method.

FIG. 4 schematically shows an example of an embodiment of method 500.

Method 500 for recovering from a low-power period starts by stage 410 of maintaining a power gated circuit in a low power mode, during a low power period.

Stage 410 is followed by stage 420 of receiving, by a control signal generator, a low power period end indicator.

Stage 420 is followed by stages 520 and 530.

Stage 520 includes determining an intensity of a voltage drop indifferent draining current generated by a strong current drain.

Stage 520 is followed by stage 525 of generating, by a strong current drain, a voltage drop indifferent draining current during a first period. The first period starts after a reception of the low power end indicator and ends when the gated power supply voltage reaches a first value.

Stage 530 includes determining an intensity of a voltage drop responsive draining current generated by a strong current drain.

Stage 530 is followed by stage 535 of generating, by the strong current drain, a voltage drop responsive draining current during a second period. The second period starts after a beginning of the first period and ends when the gated supply voltage reaches a second value that is higher than the first value and causes the high switching point buffer to output a high value signal. The voltage drop responsive draining current is responsive to a value of a voltage drop that represents a difference between the value of the continuous power supply voltage at the port of the control signal generator and the value of the continuous supply voltage at a continuous voltage supply port.

Stage 525 and 535 are followed by stage 540 of providing a control signal to a switch. The control signal includes at least one of the voltage drop indifferent draining current and the voltage drop responsive draining current.

Stage 540 is followed by stage 550 of providing, by the switch, in response to the control signal, a gated supply current to a power gated circuit.

Stage 525 can include controlling the strong current drain by a first branch of a strong current drain controller during the first period.

Stage 535 can include controlling the strong current drain by a second branch of the strong current drain controller during the second period.

Stage 535 can include mirroring by a voltage adjustment element that comprises a forward biased diode, the retention power supply voltage to the strong current drain control voltage.

Stage 525 can include providing, by the first branch and to a gate of the strong current drain, control voltages that are much above a threshold voltage of the strong current drain; and stage 535 can include providing, by the second branch and to the gate of the strong current drain control, voltages within a voltage range that comprises the threshold voltage of the strong current drain.

Either one of methods 400 and 500 can be implemented by system 200 of FIG. 1.

Referring to the power supply gating covers also the ground gating which is completely symmetric to the power supply gating. Those skilled in the art may note that in this situation the elements of the system 200 change their polarity (e.g. NMOS transistor becomes PMOS transistor and vice-versa). Obviously current drains become current sources (and vice-versa), and the control signal polarity is also changing.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A system that has low power recovery capabilities, the system comprises:
a switch that is adapted to provide a gated power supply voltage to a power gated circuit in response to a control current; and a control signal generator adapted to control an intensity of the control current in response to a reception of a low power period end indicator, a value of a continuous supply voltage at a port of the control signal generator, a value of the gated power supply voltage and an output signal of a high switching point buffer that is inputted by the gated power supply voltage.

2. The system according to claim 1 wherein the control signal generator comprises a strong current drain that contribute to the control current;
wherein the strong current drain generates a voltage drop indifferent draining current during a first period and generates a voltage drop responsive draining current during a second period;
wherein the first period starts after a reception of the low power period end indicator and ends when the gated supply voltage reaches a first value;
wherein the second period starts after a beginning of the first period and ends when the gated supply voltage reaches a second value that is higher than the first value and causes the high switching point buffer to output a high value signal;
wherein the voltage drop responsive draining current is responsive to a value of a voltage drop that represents a difference between the value of the continuous supply voltage at the port of the control signal generator and the value of the continuous supply voltage at a continuous voltage supply port.

3. The system according to claim 2 wherein the control signal generator comprises a strong current drain controller that controls the strong current drain; wherein the strong current drain controller comprises a first branch that is active during the first period and a second branch that is active during the second period.

4. The system according to claim 3 wherein the second branch comprises a voltage adjustment element that mirrors a low level voltage drop to a control voltage that activates the strong current drain and mirrors a high level voltage drop to a control voltage that deactivates the strong current drain.

5. The system according to claim 4 wherein the voltage adjustment element is a forward biased diode.

6. The system according to claim 3 wherein the first branch provides to a gate of the strong current drain control voltages that are much above a threshold voltage of the strong current drain; and wherein the second branch provides to the gate of the strong current drain control voltages within a voltage range that comprises the threshold voltage of the strong current drain.

7. A system that has low power recovery capabilities, the system comprises:
a switch that is adapted to provide a gated supply voltage to a power gated circuit in response to a control current; and
a control signal generator that comprises a strong current drain and a strong current drain controller;
wherein the strong current drain generates a voltage drop indifferent draining current during a first period and generates a voltage drop responsive draining current during a second period;
wherein the first period starts after a reception of a low power end indicator and ends when a gated supply voltage reaches a first value;
wherein the second period starts after a beginning of the first period and ends when the gated supply voltage reaches a second value that is higher than the first value;
wherein the voltage drop responsive draining current is responsive to a value of a voltage drop that represents a difference between a value of a continuous supply voltage at the port of the control signal generator and a value of the continuous supply voltage at a continuous voltage supply port.

8. The system according to claim 7 wherein the strong current drain controller comprises a first branch that is active during the first period and a second branch that is active during the second period.

9. The system according to claim 8 wherein the second branch comprises a voltage adjustment element that mirrors a low level voltage drop to a control voltage that activates the strong current drain and mirrors a high level voltage drop to a control voltage that deactivates the strong current drain.

10. The system according to claim 9 wherein the voltage adjustment element is a forward biased diode.

11. A method for recovering from a low-power period, the method comprises:
receiving a low power period end indicator;
determining an intensity of a control current in response to a value of a continuous supply voltage at a port of a control signal generator, a value of a gated power supply voltage and an output signal of a high switching point buffer that is inputted by the gated power supply voltage;
providing a control signal to a switch; and
providing, by the switch, in response to the control signal, the gated power supply voltage to a power gated circuit.

12. The method according to claim 11 comprising:
generating, by a strong current drain, a voltage drop indifferent draining current during a first period;
generating, by the strong current drain, a voltage drop responsive draining current during a second period;
wherein the first period starts after a reception of the low power end indicator and ends when the gated supply voltage reaches a first value;
wherein the second period starts after a beginning of the first period and ends when the gated supply voltage reaches a second value that is higher than the first value and causes the high switching point buffer to output a high value signal;
wherein the voltage drop responsive draining current is responsive to a value of a voltage drop that represents a difference between the value of the continuous supply voltage at the port of the control signal generator and the value of the continuous supply voltage at a continuous voltage supply port; and
wherein the control current comprises at least one of the voltage drop indifferent draining current and the voltage drop responsive draining current.

13. The method according to claim 12 comprising controlling the strong current drain by a first branch of a strong current drain controller during the first period and controlling the strong current drain by a second branch of the strong current drain controller during the second period.

14. The method according to claim 13 comprising mirroring, by a voltage adjustment element of the second branch, a low level voltage drop to a control voltage that activates the strong current drain and translating a high level voltage drop to a control voltage that deactivates the strong current drain.

15. The method according to claim 14 comprising translating by a voltage adjustment element that comprises a forward biased diode.

16. The method according to claim 13 comprising providing, by the first branch and to a gate of the strong current drain, control voltages that are much above a threshold voltage of the strong current drain; and providing, by the second branch and to the gate of the strong current drain control, voltages within a voltage range that comprises the threshold voltage of the strong current drain.

17. A method for recovering from a low-power period, the method comprises:
receiving a low power period end indicator;
generating, by a strong current drain, a power drop indifferent draining current during a first period;
generating, by the strong current drain, a power drop responsive draining current during a second period;
providing a control signal to a switch; wherein the control signal comprises at least one of the power drop indifferent draining current and the power drop responsive draining current; and
providing, by the switch, in response to the control signal, a gated supply voltage to a power gated circuit;
wherein the first period starts after a reception of the low power period end indicator and ends when the gated supply voltage reaches a first value;
wherein the second period starts after a beginning of the first period and ends when the gated supply voltage reaches a second value that is higher than the first value and causes a high switching point buffer to output a high value signal;
wherein the power drop responsive draining current is responsive to a value of a voltage drop that represents a difference between a value of a continuous supply voltage at the port of a control signal generator and a value of the continuous supply voltage at a continuous voltage supply port.

18. The method according to claim 17 comprising controlling the strong current drain by a first branch of a strong current drain controller during the first period and controlling the strong current drain by a second branch of the strong current drain controller during the second period.

19. The method according to claim 18 comprising translating by a voltage adjustment element that comprises a forward biased diode.

20. The method according to claim 19 comprising providing, by the first branch and to a gate of the strong current drain, control voltages that are much above a threshold voltage of the strong current drain; and providing, by the second branch and to the gate of the strong current drain control, voltages within a voltage range that comprises the threshold voltage of the strong current drain.

* * * * *